(12) United States Patent
Yasuoka (10) Patent No.: US 6,498,337 B2
(45) Date of Patent: Dec. 24, 2002

(54) HIGH-SPEED PHOTODETECTOR

(75) Inventor: Nami Yasuoka, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/818,522

(22) Filed: Mar. 28, 2001

(65) Prior Publication Data

US 2002/0003202 A1 Jan. 10, 2002

(30) Foreign Application Priority Data

Jul. 6, 2000 (JP) ........................................ 2000-205282

(51) Int. Cl.$^7$ ............................................... H01L 31/00
(52) U.S. Cl. ................................. 250/214.1; 385/131
(58) Field of Search ........................ 359/173; 330/307, 330/308; 385/43, 131, 132; 250/214.1

(56) References Cited

U.S. PATENT DOCUMENTS

| | | | | |
|---|---|---|---|---|
| 5,260,822 A | * | 11/1993 | Missaggia et al. | 257/431 |
| 5,325,379 A | * | 6/1994 | Amann | 372/20 |
| 5,574,289 A | * | 11/1996 | Aoki et al. | 257/17 |
| 5,598,501 A | * | 1/1997 | Maruo et al. | 385/131 |
| 5,657,338 A | * | 8/1997 | Kitamura | 372/46 |
| 5,678,935 A | * | 10/1997 | Sakata | 257/14 |
| 5,701,379 A | * | 12/1997 | Takeuchi | 257/432 |

FOREIGN PATENT DOCUMENTS

JP          7-30141          1/1995

* cited by examiner

Primary Examiner—David Porta
Assistant Examiner—Stephen Yam
(74) Attorney, Agent, or Firm—Armstrong, Westerman & Hattori, LLP (57) ABSTRACT

A photodetector includes a photodiode and an optical waveguide provided adjacent to the photodiode on a common substrate, wherein the optical waveguide includes a plurality of tapered optical waveguide layers separated by an intermediate layer having a uniform thickness, the thickness of the tapered optical waveguide layers increases from a first end surface away from the photodiode toward a second end surface adjacent to the photodiode.

7 Claims, 8 Drawing Sheets

HIGH-SPEED PHOTODETECTOR

CROSS-REFERENCE TO RELATED APPLICATION

The present application is based on Japanese priority application No.2000-205282 filed on Jul. 6, 2000, the entire contents of which are hereby incorporated by reference.

BACKGROUND OF THE INVENTION

1. Field of the Invention

The present invention generally relates to semiconductor devices and more particularly to a photodetector having an integral optical waveguide.

2. Description of the Related Art

With widespread use of information technology in human society, there is a demand for optical-fiber telecommunication systems that are capable of handling sharply increasing traffic of information.

In order to meet for this demand, there is a proposal to increase the transmission rate of the optical signals through the optical fibers from a conventional rate of 10 Gbps to a faster rate of 40 Gbps or more. When this approach is adopted, it is necessary to increase the response speed of the photodetector used in such an optical-fiber telecommunication system for detecting the optical signals.

Conventionally, PIN photodiodes have been used successfully in optical-fiber telecommunication systems as a high-speed photodetector. A PIN photodiode achieves a high response speed by providing a thin undoped semiconductor layer in a p–n junction such that the capacitance of the p–n junction is reduced.

Further, there is a proposal to increase the response speed and photosensitivity of a PIN photodiode further, by providing an integral optical waveguide adjacent to the PIN photodiode on a common semiconductor substrate.

Figure 1:
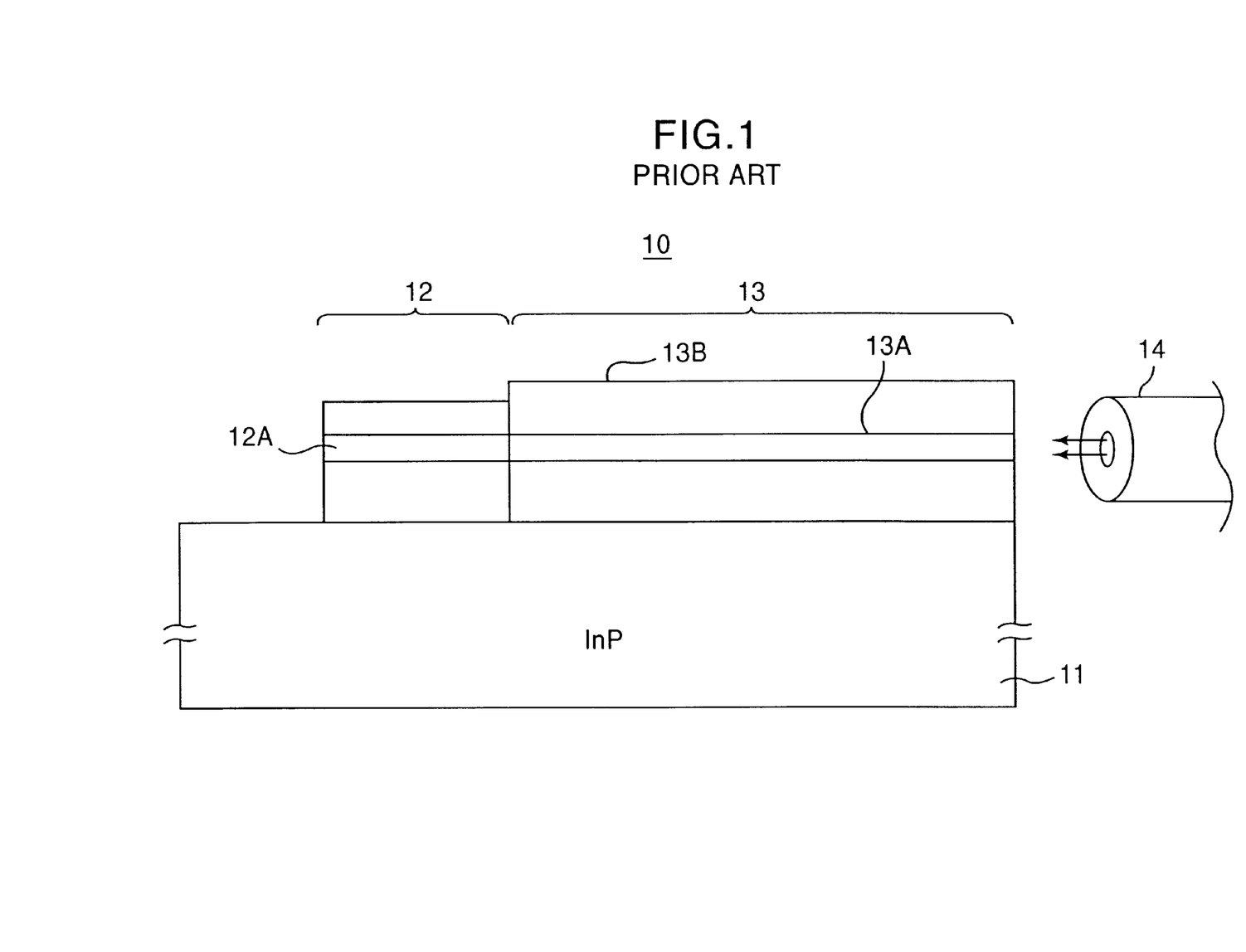
FIG. 1 is a diagram showing the construction of a photodetector according to a related art.

FIG. 1 shows the construction of a conventional PIN photodetector 10 having such an integral optical waveguide.

Referring to FIG. 1, the PIN photodetector 10 is constructed on a compound semiconductor substrate 11 typically of InP and includes a PIN photodiode 12, wherein the PIN photodiode 12 includes therein an optical absorption layer 12A formed on the compound semiconductor substrate 11, and an optical waveguide 13 is provided on the compound semiconductor substrate 11 adjacent to the PIN photodiode 12 in optical coupling therewith.

The optical waveguide 13 includes an optical waveguide layer 13A having a first end surface to which an optical beam from an external optical waveguide, such as an optical fiber 14, comes in and a second end adjacent to the PIN photodiode 12 for injecting the optical beam guided through the optical waveguide layer 13A into the PIN photodiode 12. Further, there is provided a cladding layer 13B on the optical waveguide layer 13A for confining the optical beam in the optical waveguide layer 13A.

Thus, the optical waveguide layer 13A is provided in optical coupling with the optical absorption layer 12A of the PIN photodiode 12, and there occurs an efficient injection of the optical beam guided through the optical waveguide layer 13A into the optical absorption layer 12A of the PIN photodiode 12. The construction of FIG. 1 is effective for reducing the thickness of the optical absorption layer 12A below about 1 $\mu$m without causing degradation of optical coupling between the optical waveguide layer 13A and the optical absorption layer 12A. As a result of decreased thickness of the optical absorption layer 12A, the PIN photodiode 12 shows a high response speed.

In such a PIN photodiode, it is possible to improve the response speed by providing the undoped optical absorption layer 12A between a p-type layer and an n-type layer constituting a PN junction so as to reduce the junction capacitance. On the other hand, such a construction has to be designed such that the optical absorption layer 12A has a sufficiently small thickness so as to avoid increase of the transit time of the optically excited carriers across the optical absorption layer 12A and associated degradation of the response speed of the PIN photodiode 12. From this viewpoint, it is desirable to reduce the thickness of the optical absorption layer 12A as much as possible.

On the other hand, there arises a problem, in such a conventional photodetector 10 having the optical waveguide 13 integrally to the PIN photodiode 12 and injection of optical signal occurs from the external optical fiber 14 into the PIN photodiode 12 via the optical waveguide 13, in that a large optical loss may occur at the first end surface of the optical waveguide 13 to which an optical signal in the optical fiber 14 is injected. It should be noted that the optical beam transmitted through the optical fiber 14 has a beam diameter of about 7.0 $\mu$m in terms of full-height width, while the optical waveguide layer 13A in the optical waveguide 13 has a thickness of 1 $\mu$m or less, which is substantially identical with the thickness of the optical absorption layer 12A in the PIN photodiode 12. When the thickness of the optical absorption layer 12A is increased for avoiding this problem, there arises a problem of degraded response speed of the photodiode 12.

As explained previously, it is desirable to suppress the thickness of the optical absorption layer 12A to be 1 $\mu$m or less in the PIN photodiode 12 for improving the response speed. Further, it is preferable to reduce the longitudinal length of the photodiode 12A as much as possible so that the parasitic capacitance of the p–n junction is reduced. On the other hand, such a PIN photodiode having a short longitudinal length raises a problem in that the optical beam, entered into the PIN photodiode 12 at an incident end surface with offset from the optical absorption layer 12A, tends to exit from the opposite end surface before the optical beam is effectively confined into the optical absorption layer 12A by the optical confinement action.

In order to avoid these problems, there is a proposal to provide a spherical lens at an end of the optical fiber 14 such that the optical beam in the optical fiber 14 is injected efficiently into the thin optical absorption layer 12A of the PIN photodiode 12.

However, such a construction that uses a lens in the photodetector 10 is difficult to produce because of the stringent precision required for the optical system including the lens. As a result, such a construction inevitably increases the cost of the photodetector.

SUMMARY OF THE INVENTION

Accordingly, it is a general object of the present invention to provide a novel and useful photodetector wherein the foregoing problems are eliminated.

Another and more specific object of the present invention is to provide a high-speed photodetector capable of minimizing optical loss with regard to an incoming optical beam having a large beam diameter.

Another object of the present invention is to provide a photodetector, comprising:

a substrate having a principal surface;
a photodetection part provided on a part of said principal surface of said substrate, said photodetection part comprising: an optical absorption layer of a semiconductor material extending parallel to said principal surface, said optical absorption layer causing excitation of carriers therein in response to an optical radiation supplied thereto; and
an optical waveguide provided on said principal surface of said substrate, said optical waveguide guiding an optical beam in a direction parallel to said principal surface from a first end surface to a second end surface adjacent to said photodetection part, such that said optical beam guided through said optical waveguide is injected into said optical absorption layer of said photodetection part, said optical waveguide comprising: a first tapered optical waveguide layer extending from said first end surface to said second end surface of said optical waveguide, said first tapered optical waveguide layer decreasing a thickness thereof continuously from said first end surface to said second end surface; a second tapered optical waveguide layer provided on said first tapered optical waveguide layer with a separation therefrom, said second tapered optical waveguide layer decreasing a thickness thereof continuously from said first end surface to said second end surface; and an intermediate layer having a refractive index smaller than a refractive index of any of said first and second tapered optical waveguide layers, said intermediate layer being interposed between said first and second tapered optical waveguide layers with a substantially uniform thickness.

According to the present invention, the effective refractive index of the optical waveguide, formed by the first and second tapered optical waveguide layers, increases sharply from the first end surface to the second end surface and the effect of optical confinement is enhanced sharply from the first end surface to the second end surface. As a result, a large-diameter optical beam incident to the first end surface of the optical waveguide is effectively confined into the first and second tapered optical waveguide layers as the optical beam travels from the foregoing first end surface to the second end surface and is injected into the optical absorption layer of the photodetection part effectively and efficiently. By using the two tapered optical waveguide layers, it becomes possible to increase the refractive index change between the first and second end surfaces as compared with the case of using a single tapered optical waveguide layer. Thus, the photodetector of the present invention provides a high optical coupling not achievable when a single tapered optical waveguide layer is used, while such a high efficiency of optical confinement enables use of a short longitudinal length of the photodiode constituting the photodetection part, and the response speed of the photodetector is improved.

Other objects and further features of the present invention will become apparent from the following detailed description when read in conjunction with the attached drawings.

BRIEF DESCRIPTION OF THE DRAWINGS

FIGS. 5A–5D are diagrams showing the fabrication process of the photodetector of FIG. 2;

DETAILED DESCRIPTION OF THE INVENTION

First Embodiment

Figure 2:
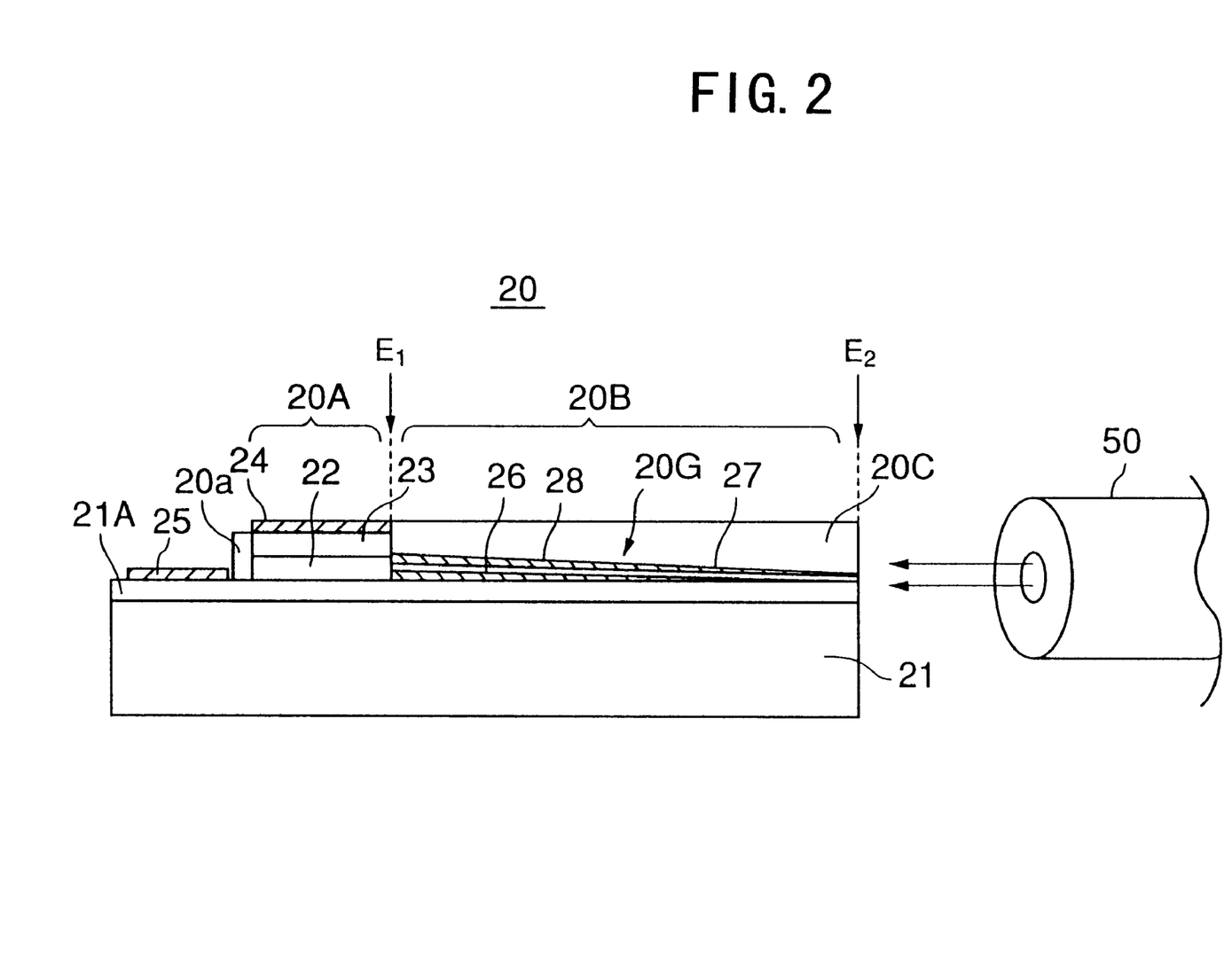
FIG. 2 is a diagram showing the construction of a photodetector according to a first embodiment of the present invention.

FIG. 2 shows the construction of a photodetector 20 according to a first embodiment of the present invention;

Referring to FIG. 2, the photodetector 20 is constructed on a substrate 21 of undoped InP having an n+-type layer 21A on a surface part thereof, wherein the n+-type layer 21A carries thereon an undoped layer 22 of InGaAsP as an optical absorption layer of a PIN photodiode 20A, and a p-type InP layer 23 is provided on the InGaAsP optical absorption layer 22 as a cladding layer of the PIN photodiode 20A.

Further, the photodetector 20 includes an optical waveguide 20B formed on the n+-type layer 21A of the substrate 21 adjacent to the PIN photodiode 20A so as to extend from a first end surface $E_1$ to a second, opposite end surface $E_2$, wherein the optical waveguide 20B includes a core region 20G having a thickness that increases gradually from the second end surface $E_2$ to the first end surface $E_1$, such that the core region 20G has a thickness corresponding to the thickness of the optical absorption layer 22 of the PIN photodiode 20A at the foregoing first end surface $E_1$.

The core layer 20G is exposed at the second end E2 with a reduced thickness, and there is formed an efficient optical coupling between the optical fiber 50 and the core region 20G at the second end E2.

Further, a p-type electrode 24 having the Au/Pt/Ti alloy structure is formed on the p-type InP cladding layer 23 and an n-type electrode 25 having the Au/Ge/Au alloy structure is formed on the substrate 21 in connect with the foregoing n+-type layer 21A. It should be noted that the sidewall of the photodiode 20A opposite to the optical waveguide 20B is covered by a semiconductor layer 20a.

It should be noted that the core layer 20G includes first and second tapered optical waveguide layers 26 and 28 both of undoped InGaAsP extending from the end surface $E_1$ to the end surface $E_2$, wherein both the optical waveguide layer 26 and the optical waveguide layer 28 increase the thickness thereof gradually and continuously from the end surface $E_2$ to the end surface $E_1$. Further, an intermediate layer 27 of undoped InP is interposed between the optical waveguide layers 26 and 28 with a substantially uniform thickness, such that the intermediate layer 27 extends form the end surface $E_1$ to the end surface $E_2$.

Further, the core layer 20G may include an additional intermediate layer 29 (not illustrated) of undoped InP formed on the tapered optical waveguide layer 28 similarly to the intermediate layer 27 and a third tapered optical waveguide layer 30 (not illustrated) of undoped InGaAsP formed on the intermediate layer 28 similarly to the optical waveguide layer 26 or 28.

Figure 3A:
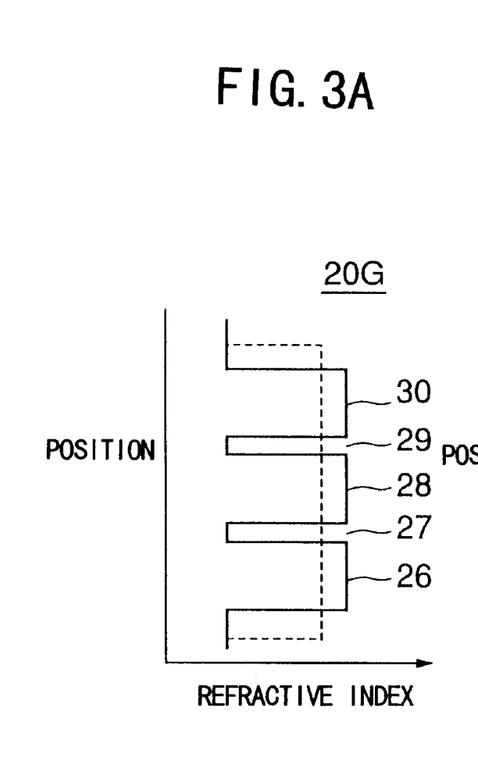
FIGS. 3A and 3B are diagrams showing the refractive index profile used in the photodetector of FIG. 2.
Figure 3B:
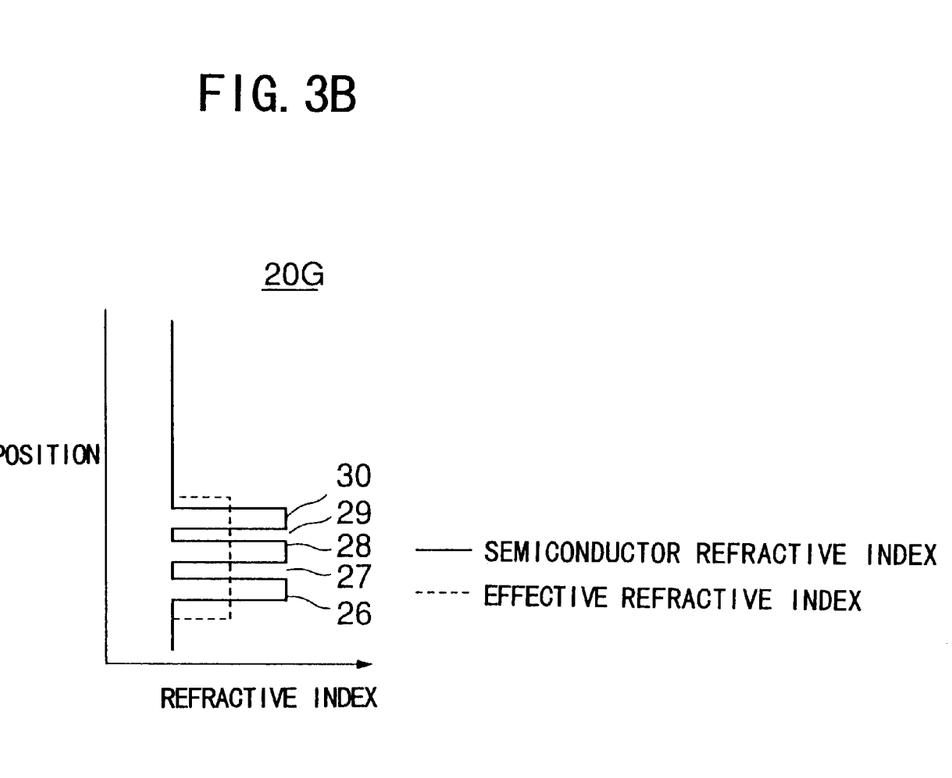

FIGS. 3A and 3B show the refractive index profile of the core region 20G respectively at the end surface $E_1$ and at the end surface $E_2$.

Referring to FIG. 3A, it can be seen that both of the tapered optical waveguide layers 26 and 28 have a thickness of about 80 nm on the end surface $E_1$ and realizes an effective refractive index of about 3.44 together with the intervening intermediate layers 27 and 29. Generally, a layered structure including an alternate and repetitive stacking of a first layer having a thickness $d_1$ and a refractive index $n_1$ and a second layer having a thickness $d_2$ and a refractive indeed $n_2$ provides an effective refractive index $n_{eff}$ represented as $$n_{eff}=(n_1d_1N_1+n_2d_2N_2)/(d_1N_1+d_2N_2) \quad (1)$$

where $N_1$ and $N_2$ represent respectively the total number of the layers having the refractive index $n_1$ and the total number of the layers having the refractive index $n_2$.

At the foregoing end surface $E_1$, it should be noted that the optical waveguide layers 26, 28 and 30 have a large thickness and hence correspondingly large contribution to the effective refractive index $n_{eff}$, and the effective refractive index $n_{eff}$ takes a value of about 3.39, which is close to the refractive index of the layer 26, 28 or 30. At the end surface $E_2$, on the other hand, the optical waveguide layers 26, 28 and 30 have a thickness generally equal to or smaller than the thickness of the intermediate layer 27 or 28 and the contribution of these layers to the effective refractive index $n_{eff}$ becomes small. Thereby, the contribution of the refractive index of the intermediate layers 27 and 29 becomes predominant at the end surface $E_2$ and the effective refractive index $n_{eff}$ takes a value of about 3.3, which is substantially smaller than the effective refractive index at the end surface $E_1$.

When an optical beam having a beam diameter of about 7 $\mu$m (3.5 $\mu$m in terms of half-height half-width value) is injected from the external optical fiber 50 into the optical waveguide 20B in which there is a large refractive index change in the propagating direction of the optical beam, most of the optical beam is injected into the cladding layer 20C at the end surface $E_1$, while the optical beam thus injected into the cladding layer 20C undergoes a transfer of optical energy to the core region 20G as the optical beam propagates toward the end surface $E_2$, and the optical beam is substantially entirely confined in the core region 20G by the time when the optical beam has reached the end surface $E_2$. At the end surface $E_2$, en efficient injection of the optical beam takes place from the foregoing core region 20G to the optical absorption layer 22 of the PIN photodiode.

In the present embodiment, it should be noted that the foregoing large refractive index change is realized in the axial direction of the core region 20G by stacking a plurality of tapered optical waveguide layers. It is known that such a tapered semiconductor layer can be formed by using an MOVPE process in combination with a tapered deposition mask, while the refractive index change achieved by such a single tapered layer is not sufficient for realizing the desired thickness difference between the end surface $E_1$ and the end surface $E_2$.

Figure 4:
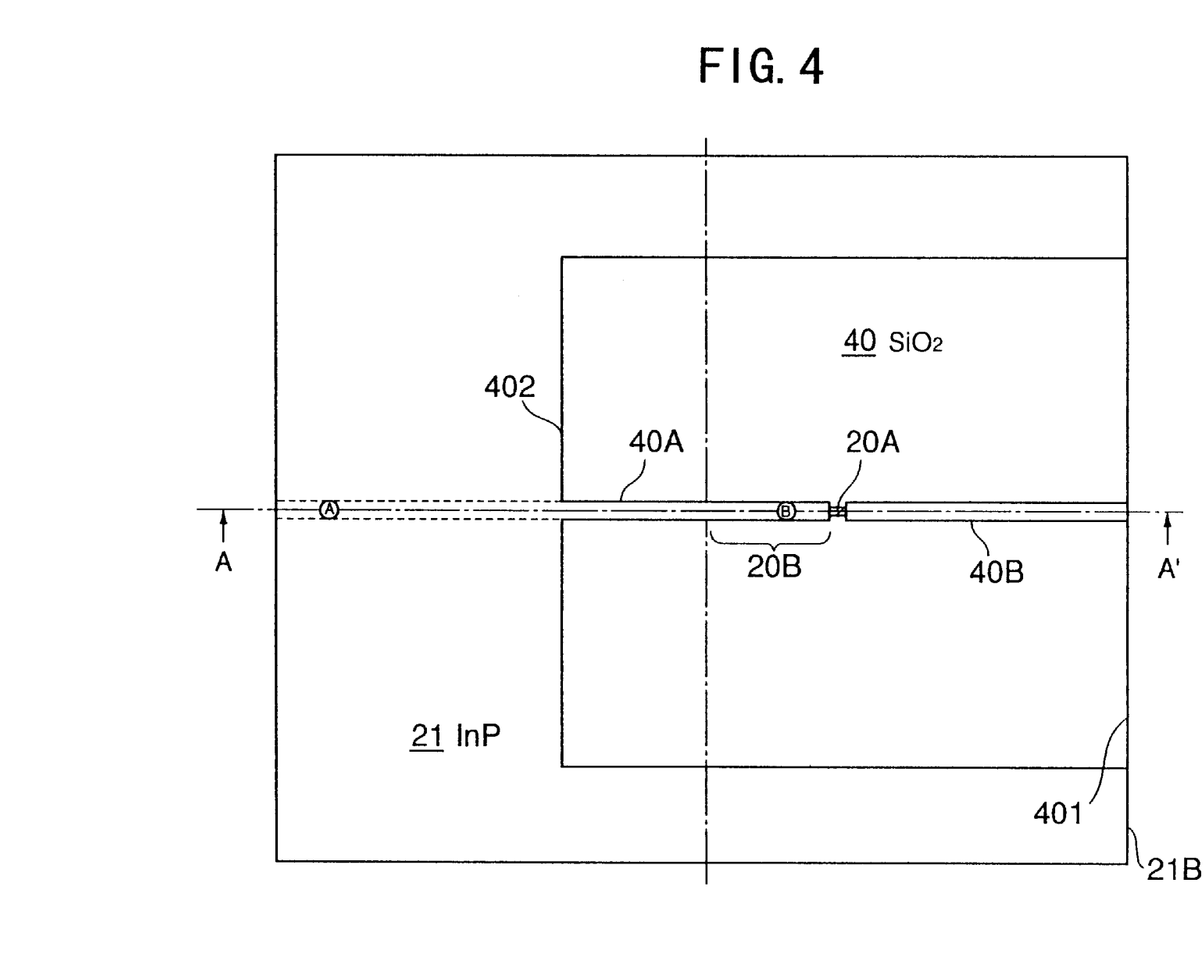
FIG. 4 is a diagram showing an example of an insulating mask pattern used when fabricating the photodetector of FIG. 2.
Figure 5A:
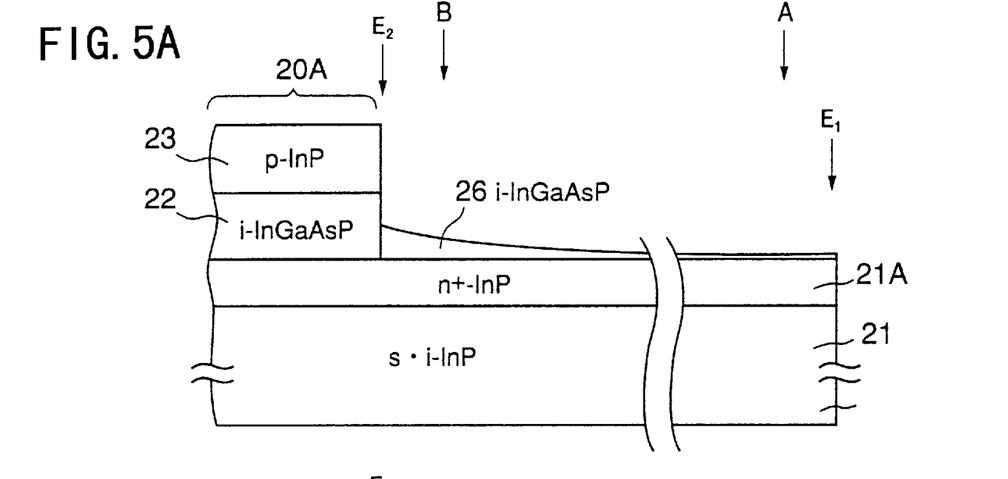
Figure 5B:
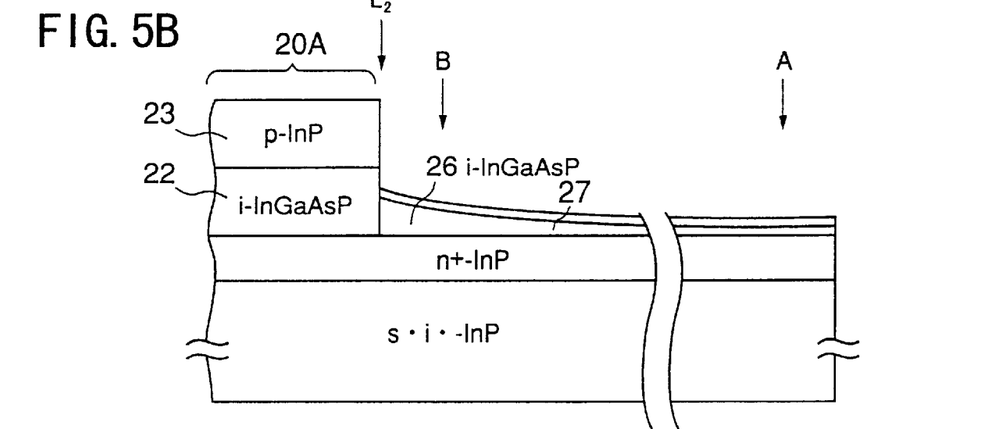

Hereinafter, the process of forming the core region 20G will be explained with reference to FIG. 4 showing an $SiO_2$ deposition mask in a plan view and FIGS. 5A–5D showing the deposition process that is conducted while using the deposition mask of FIG. 4. It should be noted that FIGS. 5A and 5B show the cross-sectional view taken along a line A—A' of FIG. 4.

Referring to FIG. 4, the InP substrate 21 has a rectangular shape with a size of 0.600 mm×0.500 mm, and a generally square SiO2 mask pattern 40 is provided such that an edge 401 of the mask pattern 40 coincides with a right edge 21B of the InP substrate 21. In such a construction, it is noted that the InP substrate 21, more precisely the n+-type region 21A on the surface of the InP substrate 21, is exposed at the left part and further at the upper and lower parts of the mask pattern 40 in the plan view of FIG. 4. The SiO2 mask pattern 40 is formed such that the PIN photodiode 20A on the substrate 21 is located generally at the center of the mask pattern 40, and there are formed a pair of elongated cutouts 40A and 40B in the mask pattern 40 such that the cutouts 40A and 40B extend straight to the PIN photodiode 20A from both lateral edges of the mask pattern 40. It should be noted that the cutouts 40A and 40B thus formed expose the top surface of the InP substrate 21.

Now referring to FIG. 5A, the optical waveguide layer 26 of InGaAsP is deposited on the InP substrate 21 by an MOVPE process that uses TMIn (trimethyl indium) for the source of In, TMGa (trimethyl gallium) for the source of Ga, $AsH_3$ for the source of As and $PH_3$ for the source of P. As a result of the MOVPE process, there occurs an epitaxial growth of the InGaAsP layer 26 exposed part of the InP substrate 21, wherein it is possible to suppress the deposition of the source atoms precipitated from the source gases, by controlling the deposition temperature at the time of the MOVPE process to about 600° C. and the total pressure to about 6.7 kPa (about 50 Torr). Under such a condition, the source atoms fell upon the mask pattern 40 undergoes migration on the surface of the mask pattern 40 and causes a deposition when they have reached the exposed surface of the InP substrate 21 at the cutout 40A. As a result, the InGaP layer 26 has a tapered cross-section at a point B of FIG. 4 as represented in FIG. 5A, in which it can be seen that the thickness of the layer 26 increases gradually and continuously toward the PIN photodiode 20A.

Next, in the step of FIG. 5B, the intermediate layer of InP is grown on the structure of FIG. 5A by an MOVPE process that uses TMIn and PH3 as the source gases. In the process of FIG. 5B, the tapered growth or selective growth is suppressed by setting the substrate temperature to 600° C. and the total pressure to about 20 kPa (about 150 Torr). As a result, the InP intermediate layer 27 is formed in the cutout 40A with a uniform thickness so as to cover the optical waveguide layer 26 underneath.

Figure 5C:
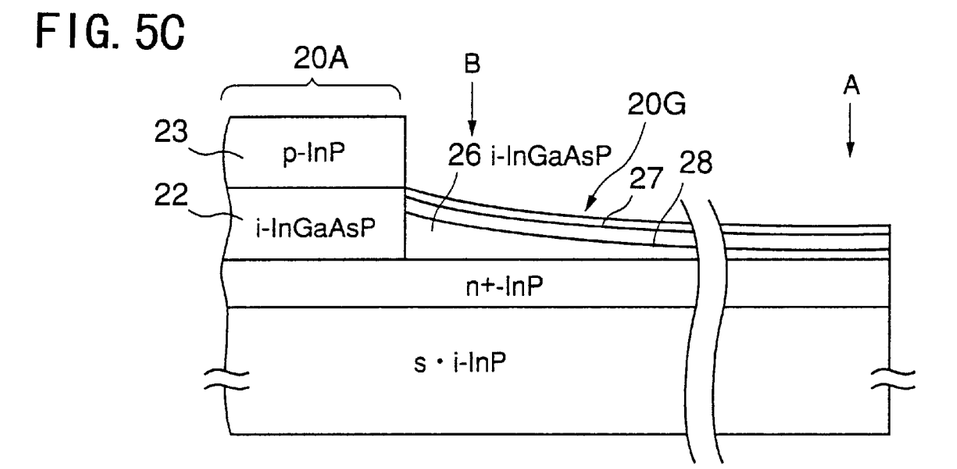

After the step of FIG. 5B, the $SiO_2$ mask pattern 40 is removed in the step of FIG. 5C, and a new $SiO_2$ pattern 40 (not shown) is provided. Further, an InGaAsP layer and an InP layer are deposited consecutively by an MOVPE process while using the newly formed $SiO_2$ pattern 40 as a deposition mask, to form the tapered InGaAsP optical waveguide layer 28 on the InP intermediate layer 27 similarly to the tapered InGaAsP optical waveguide layer 26 and the InP intermediate layer 29 on the tapered InGaAsP optical waveguide layer 28 similarly to the InP intermediate layer 27. In FIG. 5C, formation of the layers 28 and 29 are omitted because of the simplicity of illustration.

Figure 5D:
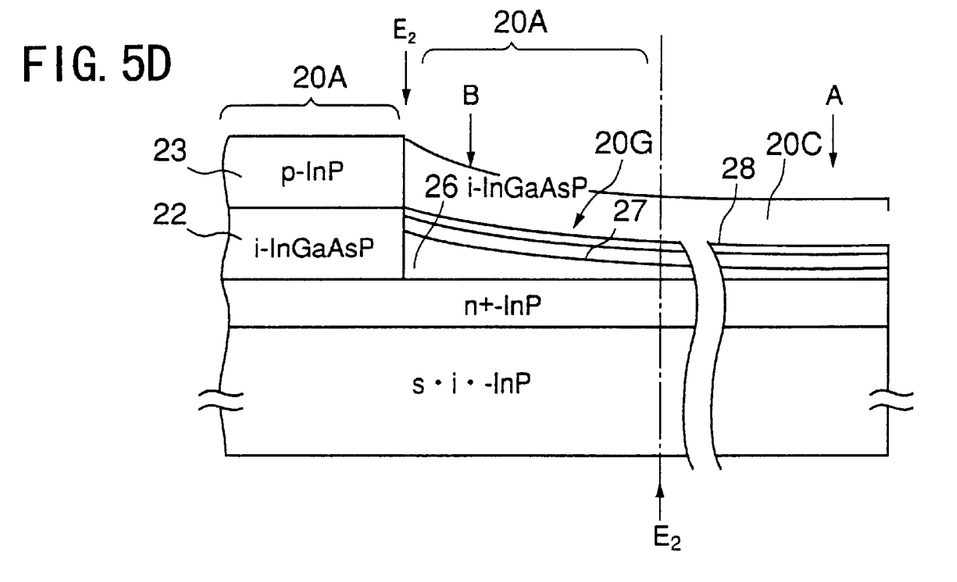

After the step of FIG. 5C, the InP cladding layer 20C is deposited on the InP substrate 21 in the step of FIG. 5D such that the InP cladding layer 20C covers the optical waveguide layer 20G and the PIN photodiode 20A thus formed. Further, the structure of FIG. 5D is subjected to a cleaning process along a one-dotted line represented in FIG. 4 and the end surface $E_2$ is formed. Further, the p-type electrode 24 is formed on the InP layer 23 and the n-type electrode 25 is formed on the n+-type region 21A on the InP substrate 21.

In the foregoing process of forming the tapered InGaAsP layers 26, 28 or 30, conducted by using the $SiO_2$ mask pattern 40, there arises a problem in that the composition of these layers may change in the elongating direction thereof.

Thus, the present embodiment adjusts the composition of the InGaAsP layers 26, 28 and 30 such that a lattice matching is achieved with respect to the InP substrate 21 at the part where the thickness thereof is maximum. More specifically, the InGaAsP layers 26, 28 and 30 are formed to have a composition of $In_{0.818}Ga_{0.182}As_{0.397}P_{0.603}$ in the part close to the end surface $E_1$.

When the InGaAsP layers 26, 28 and 30 are formed to have a composition adjusted as such, there arises, because of the compositional change induced in the elongating direction thereof as a result of the tapered growth, in that a lattice misfit of about 1% cannot be avoided in the thin part of the layer close to the end surface $E_1$. As a result of such a lattice misfit and associated lattice strain of about 1%, the refractive index of the InGaAsP layers 26, 28 and 30 is modified locally in the part close to the end surface $E_2$, wherein such a local strain of the InGaAsP layer causes a local decrease of the refractive index in the vicinity of the end surface $E_1$. Thus, such a local strain of the InGaAsP layer provides a beneficial effect of increasing the refractive index difference between the end surfaces $E_1$ and $E_2$.

In the foregoing construction, it is possible to reduce the thickness of the InGaAsP layers 26, 28 and 30 in the vicinity of the end surface $E_1$ to such an extent that a quantum well structure appears. When such a quantum well structure is formed, the refractive index of the InGaAsP layers 26, 28 and 30 is also modified beneficially in the vicinity of the end surface $E_1$.

When forming the optical waveguide layers 26, 28 and 30 by using such an $SiO_2$ mask pattern 40, a ratio of about 4 is achieved between the thickness at the end surface $E_1$ and the thickness at the end surface $E_2$. Thus, as long as a single tapered layer is used, the foregoing ratio cannot be increased further and the refractive index change achievable by such a tapered optical waveguide structure is limited.

In view of the situation noted above, the present invention increases the thickness ratio further, by intervening the intermediate layer having a constant thickness between the tapered optical waveguide layers. Because of the existence of such a large refractive index change between the end surfaces $E_1$ and $E_2$, the optical beam propagating through the core region 20G from the end surface $E_1$ to the end surface $E_1$ while experiencing mode conversion is confined strongly in the core region 20G at the end surface E2, and the optical beam is injected efficiently into the optical absorption layer 22 of the PIN photodiode 20A.

In the present embodiment, it should be noted that the external optical waveguide 50 is not limited to an optical fiber but may be a different optical waveguide.

Second Embodiment

Figure 6:
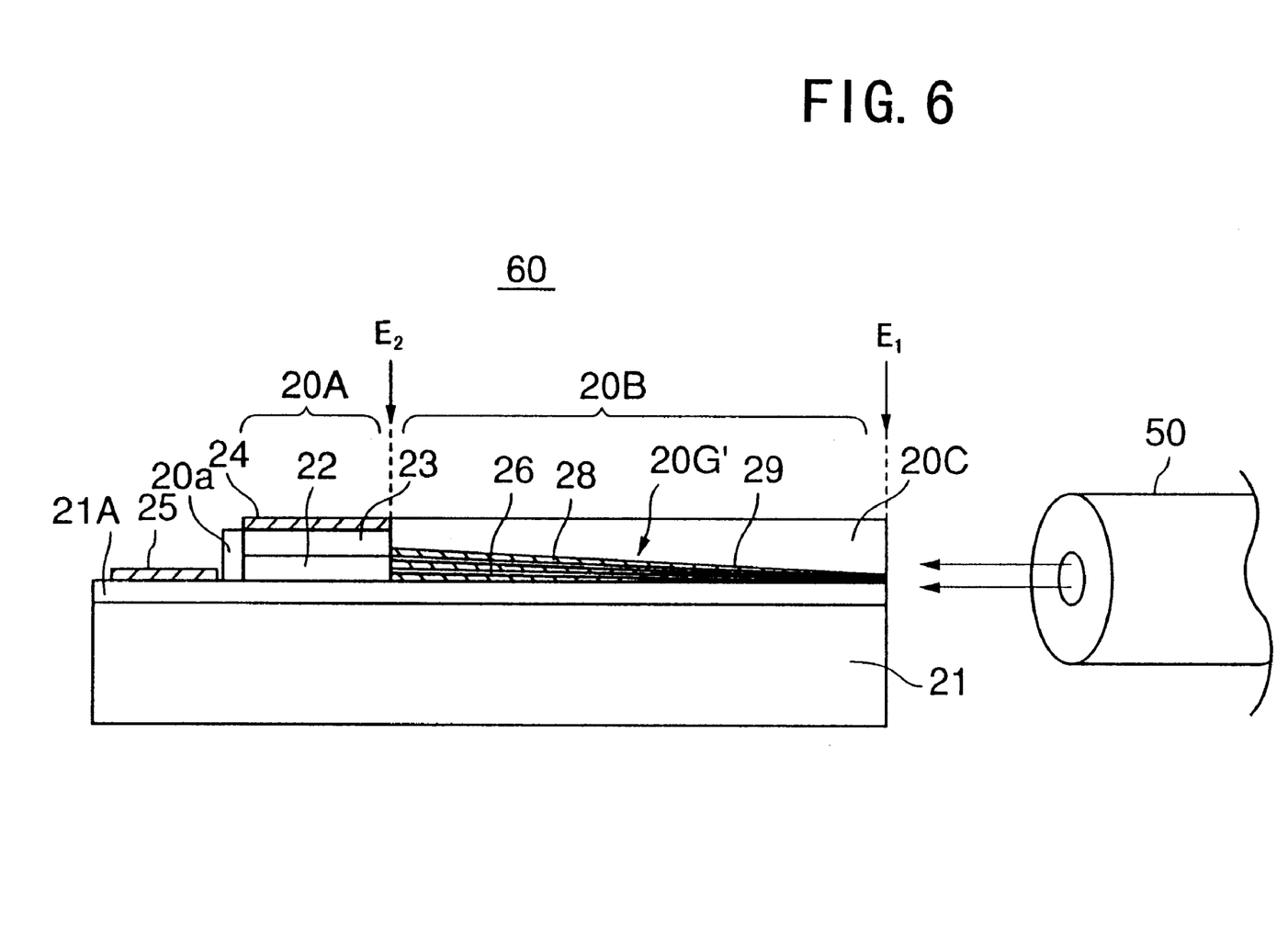
FIG. 6 is a diagram showing the construction of a photodetector according to a second embodiment of the present invention.

FIG. 6 shows the construction of a photodetector 60 according to a second embodiment of the present invention, wherein those parts corresponding to the parts described previously are designated by the same reference numerals and the description thereof will be omitted.

Referring to FIG. 6, the photodetector 60 has a construction substantially identical with that of the photodetector 20 of the previous embodiment, except that the core region 20G is replaced with a core region 20G'.

Figure 7A:
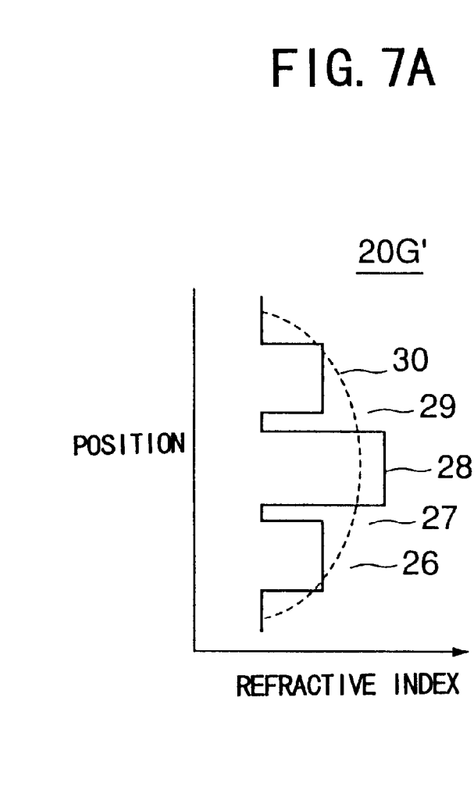
FIGS. 7A and 7B are diagrams showing the refractive index profile in the photodetector of FIG. 6.
Figure 7B:
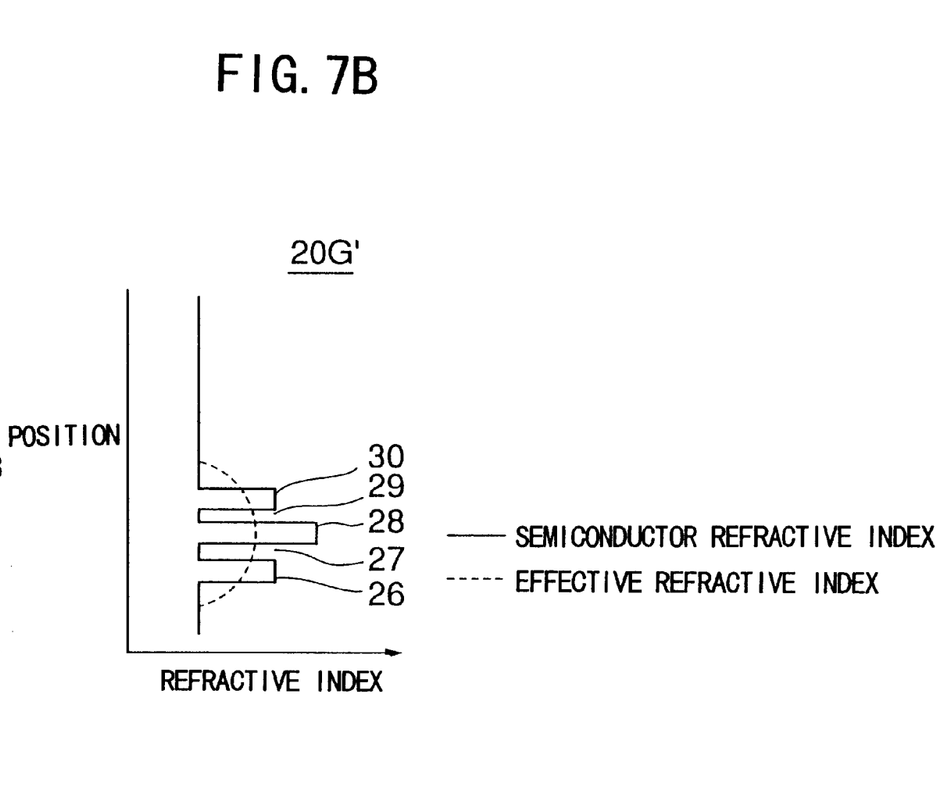

FIGS. 7A and 7B show the refractive index profile in the plane perpendicular to the optical axis of the core region 20G'.

Referring to FIGS. 8A and 8B, the composition of the optical waveguide layers 26 and 30 is changed with respect to the composition of the central optical waveguide layer 28 in the present embodiment, and there is formed a refractive index profile that is large in the central part and small at the top and bottom parts of the core region 20G'. For example, the central optical waveguide layer 28 may have a composition of $In_{0.749}Ga_{0.251}As_{0.534}P_{0.457}$ while the upper and lower optical waveguide layers 26 and 30 may have a composition of $In_{0.854}Ga_{0.146}As_{0.317}P_{0.683}$. By forming such a refractive index change, the optical beam incident to the core region 20G' from the external optical fiber 50 is effectively confined into the core region 50G'.

Otherwise, the photodetector 60 of the present embodiment is identical with the photodetector 20 of the previous embodiment and further description thereof will be omitted.

In each of the preceding embodiments, it should be noted that the p-type electrode 24 and the n-type electrode 25 may take a coplanar construction for facilitating high-speed operation. In this case, the n-type electrode 25 is formed to have a height flush with the p-type electrode 24 at both lateral sides of the PIN photodiode 20A. Such a tall electrode 25 can formed by an electrolytic plating process.

Further, the present invention is not limited to the embodiments described heretofore, but various variations and modifications may be made without departing form the scope of the invention.

What is claimed is:

1. A photodetector, comprising:

a substrate having a principal surface;

a photodetection part provided on a part of said principal surface of said substrate, said photodetection part comprising: an optical absorption layer of a semiconductor material extending parallel to said principal surface, said optical absorption layer causing excitation of carriers therein in response to an optical radiation supplied thereto; and an optical waveguide provided on said principal surface of said substrate, said optical waveguide guiding an optical beam in a direction parallel to said principal surface from a first end surface thereof to a second end surface thereof located adjacent to said photodetection part, such that said optical beam guided through said optical waveguide is injected into said optical absorption layer of said photodetection part, said optical waveguide comprising: a first tapered optical waveguide layer extending from said first end surface to said second end surface, said first tapered optical waveguide layer increasing a thickness thereof continuously from said first end surface to said second end surface; a second tapered optical waveguide layer provided on said first tapered optical waveguide layer with a separation therefrom, said second tapered optical waveguide layer increasing a thickness thereof continuously from said first end surface to said second end surface; and an intermediate layer having a refractive index smaller than a refractive index of any of said first and second tapered optical waveguide layers, said intermediate layer being interposed between said first and second tapered optical waveguide layers.

2. A photodetector as claimed in claim 1, wherein said first and second tapered optical waveguide layers having a substantially identical composition.

3. A photodetector as claimed in claim 1, wherein said first and second tapered optical waveguide layers form a quantum well structure in the vicinity of said first end surface.

4. A photodetector as claimed in claim 1, wherein said first and second tapered optical waveguide layers accumulate a lattice strain of about 1% in the vicinity of said second end surface.

5. A photodetector as claimed in claim 1, wherein said optical waveguide further comprises an intermediate layer on said second tapered optical waveguide layer and a third tapered optical waveguide layer on said intermediate layer, such that said third optical waveguide layer increases a thickness thereof continuously from said first end surface to said second end surface, said second tapered optical waveguide layer having a refractive index larger than any of said first and third tapered optical waveguide layers.

6. A photodetector as claimed in claim 1, wherein said optical waveguide has an effective refractive index of about 3.39 at said second end surface and an effective refractive index of about 3.3 at said first end surface.

7. A photodetector as claimed in claim 1, wherein each of said first and second tapered optical waveguide layers has a thickness, at said first end surface, less than about four times a thickness at said second end surface.

* * * * *